(12) United States Patent
Kim

(10) Patent No.: US 12,477,935 B2
(45) Date of Patent: Nov. 18, 2025

(54) TOP EMISSION TYPE ELECTROLUMINESCENCE DISPLAY HAVING MICRO-CAVITY STRUCTURE

(71) Applicant: LG Display Co., Ltd., Seoul (KR)

(72) Inventor: Minki Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 443 days.

(21) Appl. No.: 17/991,485

(22) Filed: Nov. 21, 2022

(65) Prior Publication Data
US 2023/0209874 A1    Jun. 29, 2023

(30) Foreign Application Priority Data
Dec. 29, 2021    (KR) .................... 10-2021-0191114

(51) Int. Cl.
*H10K 59/80*    (2023.01)
*H10K 59/12*    (2023.01)
*H10K 59/38*    (2023.01)

(52) U.S. Cl.
CPC ........... *H10K 59/876* (2023.02); *H10K 59/38* (2023.02); *H10K 59/12* (2023.02)

(58) Field of Classification Search
CPC .... H10K 50/852; H10K 59/38; H10K 50/844; H10K 59/35; H10K 59/12
See application file for complete search history.

(56) References Cited

U.S. PATENT DOCUMENTS

| | | | |
|---|---|---|---|
| 7,863,808 B2* | 1/2011 | Terao | H10K 59/876 |
| | | | 313/506 |
| 2018/0122868 A1* | 5/2018 | Kim | H10K 50/84 |
| 2018/0151628 A1* | 5/2018 | Park | H10K 59/35 |
| 2020/0185650 A1* | 6/2020 | Lim | H10K 59/122 |
| 2021/0175468 A1* | 6/2021 | Lee | H10K 59/40 |
| 2023/0163258 A1* | 5/2023 | Yoon | H10H 20/862 |
| | | | 257/555 |

FOREIGN PATENT DOCUMENTS

KR    10-1380869 B1    4/2014

* cited by examiner

*Primary Examiner* — Nduka E Ojeh
(74) *Attorney, Agent, or Firm* — Birch, Stewart, Kolasch & Birch, LLP

(57) ABSTRACT

Discussed is an electroluminescence display that can include a substrate; and a plurality of pixels on the substrate. Each pixel can include a first electrode, a light emission layer on the first electrode, and a second electrode on the light emission layer. Each pixel can also include a half transparent layer on the second electrode, and a color filter on the half transparent layer.

19 Claims, 6 Drawing Sheets

TOP EMISSION TYPE ELECTROLUMINESCENCE DISPLAY HAVING MICRO-CAVITY STRUCTURE

CROSS-REFERENCE TO RELATED APPLICATIONS

This application claims the benefit of priority to the Korean Patent Application No. 10-2021-0191114 filed in the Republic of Korea on Dec. 29, 2021, the entire contents of which are hereby expressly incorporated by reference into the present application.

BACKGROUND OF THE DISCLOSURE

Field of the Invention

The embodiments of present disclosure relate to a top emission type electroluminescence display having a micro-cavity structure. In particular, the present disclosure relates to a top emission type electroluminescence display implementing a micro-cavity structure in which a semi-transparent layer is differently configured according to each color pixel between cathode electrode and color filter.

Discussion of the Related Art

Recently, various type of displays have been developed, which include such displays as cathode ray tubes (CRTs), liquid crystal displays (LCDs), plasma display panels (PDPs) and electroluminescence displays. These various types of displays are used to display image data and are used in various products such as computers, mobile phones, bank deposit and withdrawal devices (ATMs), and vehicle navigation systems according to their specific characteristics and purposes.

In particular, the electroluminescence display is a self-luminous display, which has an excellent optical performance such as a viewing angle and color realization degree, so that its application field is gradually widening, and the electroluminescence display is receiving more attention for use as an image display device. Due to these advantages, the electroluminescence display is attracting attention as a suitable display for implementing 4K ultra-high-resolution display, and can be usable as an 8K ultra-high-resolution display. As the resolution is increased, the size of the pixel becomes smaller and the size of the emission area occupied in the pixel also becomes smaller. When the size of a pixel in the electroluminescence display becomes small, a top emission type structure can be used in order to maximize the size ratio of the emission area in the pixel.

In particular, an electroluminescence display having a resolution of 3,000 PPI (Pixel Per Inch) can have a structure in which a black matrix which prevents color mixing between pixels is removed in order to implement ultra high resolution. However, when there is no black matrix, color mixing can occur between pixels representing different colors, thereby degrading the image quality.

In addition, in a structure that implements ultra-high resolution, since the size of the pixel is very small, it is important to increase the luminous efficiency of the pixel. For example, it is possible to increase the luminous efficiency of the pixel by implementing a micro-cavity structure. Considering various conditions, in implementing an ultra-high resolution of 3,000 PPI or higher, it is desirable to develop a new structure of an electroluminescence display capable of preventing color mixing without having a black matrix and at the same time implementing a micro-cavity structure.

SUMMARY OF THE DISCLOSURE

The purpose of the present disclosure, as for addressing the problems described above and other limitations associated with the related art, is to provide an electroluminescence display having a structure capable of increasing luminous efficiency and preventing color mixing in implementing ultra-high resolution.

Another purpose of the present disclosure is to provide an electroluminescence display that implements a micro-cavity structure and has a structure for preventing the color mixing without use of a black matrix.

The electroluminescence display according to embodiments of the present disclosure can include a light emitting element is formed on a substrate, and a color filter implementing a micro-cavity structure is stacked thereon. Accordingly, the present disclosure can provide a top emission type electroluminescence display in which luminous efficiency is maximized for each color. In particular, since the light emitting device is disposed to overlap the driving element, the area ratio of the emission area occupied in the pixel area can be maximized. In addition, it has a structure in which a transparent layer or an air layer having a lower refractive index than the color filter is interposed between adjacent color filters. Therefore, when the light incident from the light emitting element to the color filter can be diffused in the lateral direction, it is totally reflected due to the transparent layer or the air layer having a low refractive index, thereby preventing color mixing. For the electroluminescence display according to the present disclosure, even without a black matrix, color mixing may not be occurred between neighboring pixels, so that ultra-high resolution can be realized. In addition, by implementing the micro-cavity structure, it is possible to maximize the luminous efficiency.

In another embodiment, an electroluminescence display can include a substrate; and a plurality of pixels on the substrate, each pixel including a first electrode, a light emission layer on the first electrode, and a second electrode on the light emission layer. Each pixel can include a half transparent layer on the second electrode, and a color filter on the half transparent layer.

A color filter of each pixel can be separated from a color filter of an adjacent pixel by a gap.

The plurality of pixels can include a first pixel including a first color filter, a second pixel including a second color filter, and a third pixel including a third color filter, and each pixel can further include a transparent layer.

The transparent layer can be in plural, and for the first pixel, a first transparent layer and a second transparent layer can be both above the color filter, for the second pixel, the first transparent layer can be below the half transparent layer and the second transparent layer is above the color filter, and for the third pixel, the first transparent layer and the second transparent layer can be both below the half transparent layer.

The first transparent layer can be further between the first color filter and the the second color filter, the second transparent layer can be further between the second color filter and the third color filter, and both the first transparent layer and the second transparent layer can be further between the third color filter and the first color filter.

The plurality of pixels can include a first pixel including a first color filter, a second pixel including a second color filter, and a third pixel including a third color filter, the first pixel need not include a transparent layer, the second pixel can include a first transparent layer below the half transparent layer, and the third pixel can include the first transparent layer and a second transparent layer both below the half transparent layer.

The first transparent layer can be further between the first color filter and the the second color filter, the second transparent layer can be further between the second color filter and the third color filter, and both the first transparent layer and the second transparent layer can be further between the third color filter and the first color filter.

An air layer can be further between the first color filter and the the second color filter, between the second color filter and the third color filter, and between the third color filter and the first color filter.

The first transparent layer can be interposed between the half transparent layer of the first pixel and the half transparent layer of the second pixel, the second transparent layer can be interposed between the half transparent layer of the second pixel and the half transparent layer of the third pixel, and both the first transparent layer and the second transparent layer can be interposed between the third color filter and the first color filter.

The plurality of pixels can include a first pixel including a first color filter, a second pixel including a second color filter, and a third pixel including a third color filter, the first pixel can include a third transparent layer below the half transparent layer, the second pixel can include a first transparent layer below the half transparent layer, and the third pixel can include the first transparent layer and a second transparent layer both below the half transparent layer, and a thickness of the third transparent layer can be less than a thickness of the first transparent layer.

The transparent layer can have a first refractive index that is lower than a refractive index of each color filter.

In the adjacent pixel, the first transparent layer can be disposed between light emitting diode and the color filter, or the color filter can be disposed between the light emitting diode and the first transparent layer.

The adjacent pixel can further include a second transparent layer having a second refractive index that is lower than the refractive index of the color filter of the adjacent pixel, and the second transparent layer can be further located in the gap.

In the adjacent pixel, the second transparent layer can be disposed between light emitting diode and the color filter, or the color filter can be disposed between the light emitting diode and the second transparent layer.

Outer surfaces of the plurality of pixels can be coplanar.

The half transparent layer can include a metal, and the metal can include at least one of silver (Ag), aluminum (Al), molybdenum (Mo), gold (Au), magnesium (Mg), calcium (Ca) and barium (Ba), or an alloy thereof.

The transparent layer can include a dielectric material, and the dielectric material can be at least one of aluminum oxide, silicon oxide, silicon nitride, polyimide and a monomer.

A black matrix need not be included between the plurality of pixels.

The half transparent layer and the color filter of each pixel can have a same width.

The plurality pixels can include a blue pixel including a blue color filter, a green pixel including a green color filter and a red pixel including a red color filter,

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
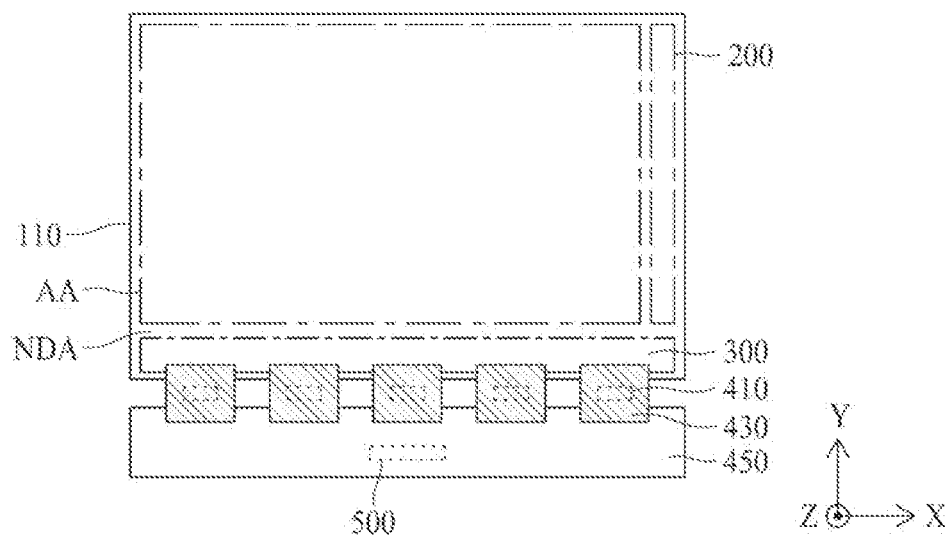
FIG. 1 is a plane view illustrating a schematic structure of an electroluminescence display according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

Reference will now be made in detail to the various embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the instance that "comprise," "have," and "include" described in the present specification are used, another part can also be present unless "only" is used. The terms in a singular form can include plural forms unless noted to the contrary.

In construing an element, the element is construed as including an error range although there is no explicit description.

In describing a positional relationship, for example, when the positional order is described as "on," "above," "below," and "next," the instance of no contact there-between can be included, unless "just" or "direct" is used. If it is mentioned that a first element is positioned "on" a second element, it does not mean that the first element is essentially positioned above the second element in the figure. The upper part and the lower part of an object concerned can be changed depending on the orientation of the object. Consequently, the instance in which a first element is positioned "on" a second element includes the instance in which the first element is positioned "below" the second element as well as the instance in which the first element is positioned "above" the second element in the figure or in an actual configuration.

In describing a temporal relationship, for example, when the temporal order is described as "after," "subsequent," "next," and "before," an instance which is not continuous can be included, unless "just" or "direct" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) can be used. These terms are only to distinguish the elements from other elements, and the terms are not limited in nature, order, sequence or number of the elements. When an element is described as being "linked", "coupled" or "connected" to another element that element can be directly connected to or connected to that other element, but indirectly unless otherwise specified. It is to be understood that other elements can be "interposed" between each element that can be connected to or coupled to.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, example embodiments of a display apparatus according to the present disclosure will be described in detail with reference to the accompanying drawings. In designating reference numerals to elements of each drawing, the same components can have the same reference numerals as much as possible even though they are shown in different drawings. Scale of the elements shown in the accompanying drawings can have a different scale from an actual elements for convenience of description, and such elements need not be limited to the scale shown in the drawings.

Hereinafter, referring to attached figures, embodiments of the present disclosure will be explained in detail.

FIG. 1 is a plane view illustrating a schematic structure of an electroluminescence display according to an embodiment of the present disclosure. In FIG. 1, an X-axis can be parallel to the extending direction of the scan line, a Y-axis can be parallel to the extending direction of the data line, and a Z-axis can represent a thickness direction of the display. All components of each electroluminescence display according to all embodiments of the present disclosure are operatively coupled and configured.

Referring to FIG. 1, the electroluminescence display can include a substrate 110, a gate (or scan) driver 200, a data pad portion 300, a source driving IC (Integrated Circuit) 410, a flexible film 430, a circuit board 450, and a timing controller 500.

The substrate 110 can include an electrical insulating material or a flexible material. The substrate 110 can be made of a glass, a metal or a plastic, but materials for the substrate 100 need not be limited thereto. When the electroluminescence display is a flexible display, the substrate 110 can be made of the flexible material such as plastic. For example, the substrate 110 can include a transparent polyimide material, for example.

The substrate 110 can include a display area AA and a non-display area NDA. The display area AA, which is an area for displaying video images, can be defined as the majority middle area of the substrate 110, but it is not limited thereto. In the display area AA, a plurality of scan lines (or gate lines), a plurality of data lines and a plurality of pixels can be included. Each of the pixels can include a plurality of sub pixels. Each of the sub pixels can include the scan line and the data line, respectively.

The non-display area NDA, which is an area not displaying the video images, can be defined at the circumference areas of the substrate 110 surrounding all or some of the display area AA. In the non-display area NDA, the gate driver 200 and the data pad portion 300 can be included, formed or disposed.

The gate driver 200 can supply the scan (or gate) signals to the scan lines according to the gate control signal received from the timing controller 500. The gate driver 200 can be formed at the non-display area NDA at any location outside of the display area AA on the substrate 110, as a GIP (Gate driver In Panel) type. GIP type means that the gate driver 200 is directly formed on the substrate 110.

The data pad portion 300 can supply the data signals to the data line according to the data control signal received from the timing controller 500. The data pad portion 300 can be made as a driver chip and mounted on the flexible film 430. Further, the flexible film 430 can be attached at the non-display area NDA at any location outside of the display area AA on the substrate 110, as a TAB (Tape Automated Bonding) type.

The source driving IC 410 can receive the digital video data and the source control signal from the timing controller 500. The source driving IC 410 can convert the digital video data into the analog data voltages according to the source control signal and then supply analog data voltages to the data lines. When the source driving IC 410 is made as a chip type, it can be installed on the flexible film 430 as a COF (Chip On Film) or COP (Chip On Plastic) type.

The flexible film 430 can include a plurality of first link lines connecting the data pad portion 300 to the source driving IC 410, and a plurality of second link lines connecting the data pad portion 300 to the circuit board 450. The flexible film 430 can be attached on the data pad portion 300 using an anisotropic conducting film, so that the data pad portion 300 can be connected to the first link lines of the flexible film 430.

The circuit board 450 can be attached to the flexible film 430. The circuit board 450 can include a plurality of circuits implemented as the driving chips. For example, the circuit board 450 can be a printed circuit board or a flexible printed circuit board.

The timing controller 500 can receive the digital video data and the timing signal from an external system board through the line cables of the circuit board 450. The timing controller 500 can generate a gate control signal for controlling the operation timing of the gate driver 200 and a source control signal for controlling the source driving IC 410, based on the timing signal. The timing controller 500 can supply the gate control signal to the gate driver 200 and supply the source control signal to the source driving IC 410. Depending on the product types, the timing controller 500 can be formed as one chip with the source driving IC 410 and mounted on the substrate 110.

Figure 2:
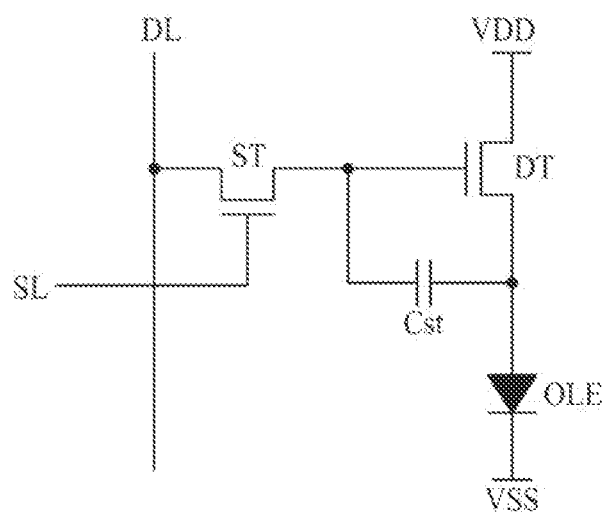
FIG. 2 is a circuit diagram illustrating a structure of a pixel according to the embodiment of the present disclosure.
Figure 3:
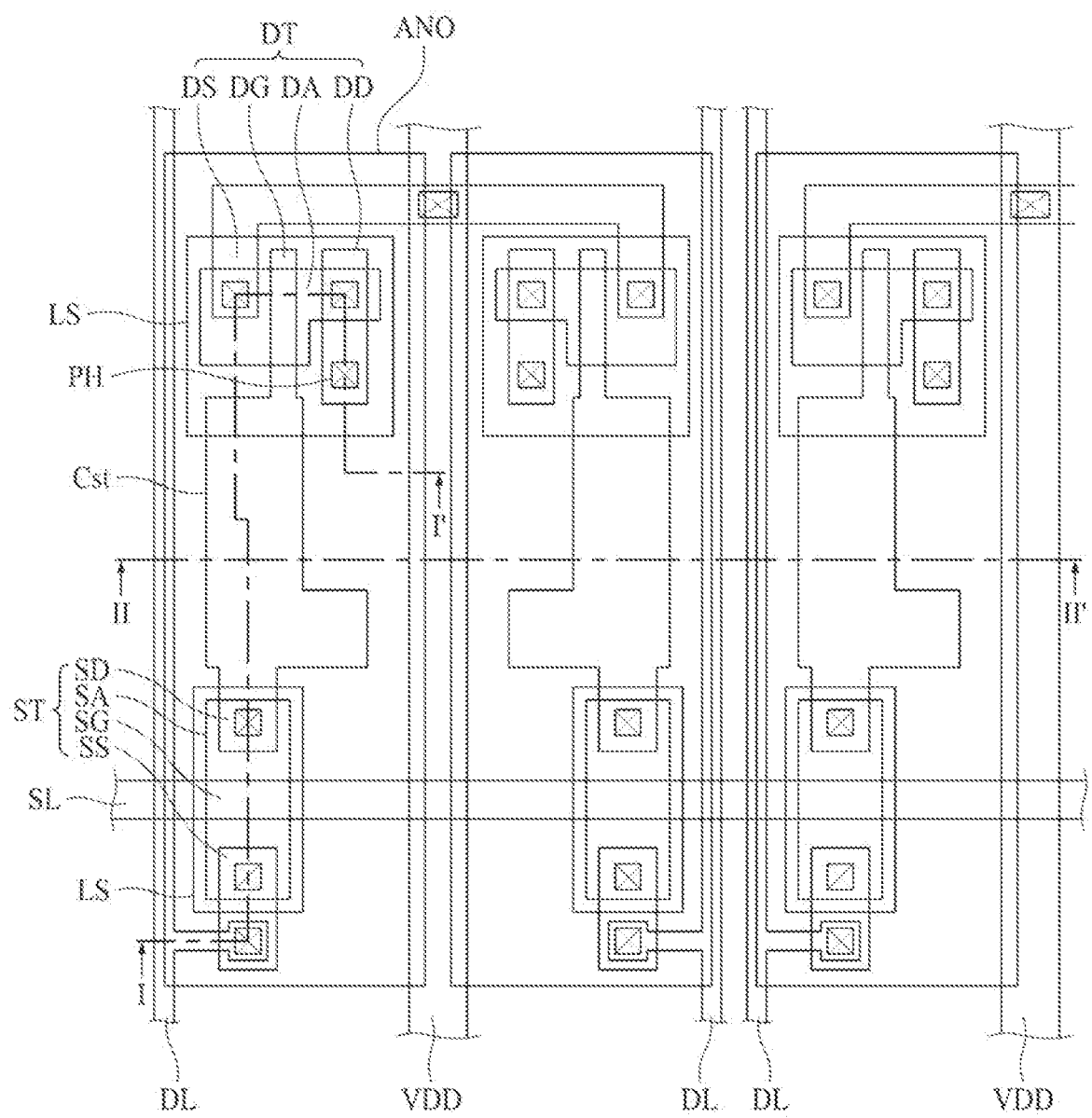
FIG. 3 is an enlarged plan view illustrating a structure of the pixels disposed in the electroluminescence display according to the embodiment of the present disclosure.
Figure 4:
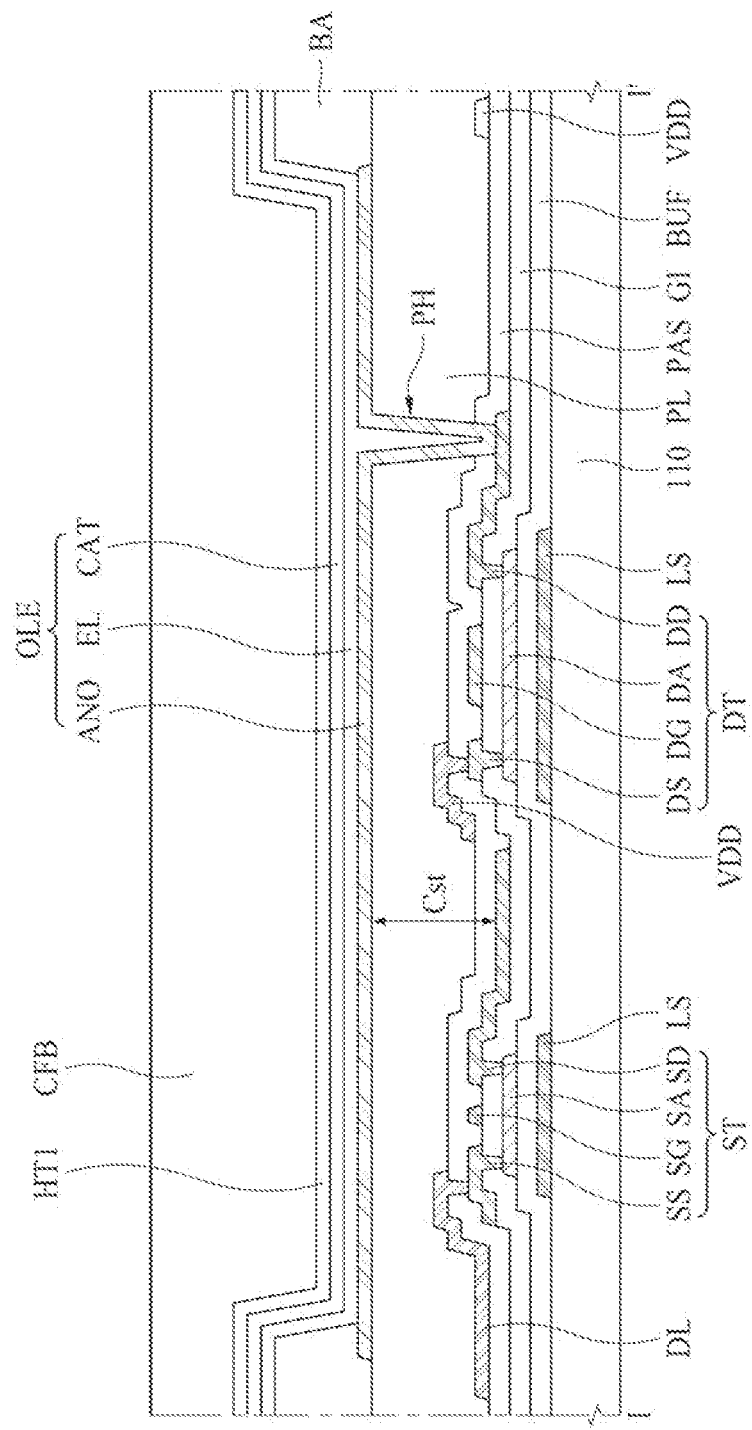
FIG. 4 is a cross-sectional view along to cutting line I-I' in FIG. 3, for illustrating the structure of the electroluminescence display according to the embodiment of the present disclosure.

FIG. 2 is a circuit diagram illustrating a structure of a pixel according to the embodiment of the present disclosure. FIG. 3 is an enlarged plan view illustrating a structure of the pixels disposed in the electroluminescence display according to the embodiment of the present disclosure. FIG. 4 is a cross-sectional view along to cutting line I-I' in FIG. 3, for illustrating the structure of the electroluminescence display according to the embodiment of the present disclosure.

Referring to FIGS. 2 to 4, each pixel of the light emitting display can include a scan line SL, a data line DL and a driving current line VDD. Each pixel of the light emitting display can include a switching thin film transistor ST, a driving thin film transistor DT, a light emitting diode OLE and a storage capacitor Cst. The driving current line VDD can be supplied with a high-level voltage for driving the light emitting diode OLE.

For example, the switching thin film transistor ST can be disposed at the portion where the scan line SL and the data line DL are crossing. The switching thin film transistor ST can include a switching gate electrode SG, a switching source electrode SS and a switching drain electrode SD. The switching gate electrode SG can be branched from the scan line SL, or it can be defined as a portion of the scan line SL, as shown in FIG. 3. The switching source electrode SS can be connected to the data line DL and the switching drain electrode SD can be connected to the driving thin film transistor DT. By supplying the data signal to the driving thin film transistor DT, the switching thin film transistor ST can play a role of selecting a pixel which can be driven.

The driving thin film transistor DT can play a role of driving the light emitting diode OLE of the pixel selected by the switching thin film transistor ST. The driving thin film transistor DT can include a driving gate electrode DG, a driving source electrode DS and a driving drain electrode DD. The driving gate electrode DG can be connected to the switching drain electrode SD of the switching thin film transistor ST. The driving source electrode DS can be connected to the driving current line VDD, and the driving drain electrode DD can be connected to an anode electrode ANO of the light emitting diode OLE. A storage capacitor Cst can be disposed between the switching drain electrode SD of the switching thin film transistor ST and the anode electrode ANO of the light emitting diode OLE.

The driving thin film transistor DT can be disposed between the driving current line VDD and the light emitting diode OLE. The driving thin film transistor DT can control the amount of electric currents flowing to the light emitting diode OLE from the driving current line VDD according to the voltage level of the driving gate electrode DG connected to the switching drain electrode SD of the switching thin film transistor ST.

FIG. 4 shows the thin film transistors ST and DT having the top gate structure. The top gate structure means that the gate electrodes SG and DG are disposed on the semiconductor layers SA and DA. In detail, the top gate structure can have the semiconductor layers SA and DA first formed on the substrate 110, and the gate electrodes SG and DG formed on the gate insulating layer GI covering the semiconductor layers SA and DA. For another example, the electroluminescence display according to the present disclosure can have a bottom gate structure. The bottom gate structure can have the gate electrodes SG and DG first formed on the substrate 110, and the semiconductor layers SA and DA formed on the gate insulating layer GI covering the gate electrodes SG and DG. By example, the electroluminescence display according to the present disclosure, in implementing ultra-high resolution density, can include a thin film transistor having a top gate structure in order to increase the aperture ratio, which is the ratio of the emission area to the pixel area In addition, according to the top gate structure shown in FIG. 4, the switching source electrode SS, the switching drain electrode SD, the driving source electrode DS and the driving drain electrode DD can be formed on the same layer with the gate electrodes SG and DG. In other word, the source electrodes SS and DS and the drain electrodes SD and DD can be formed on the same layer with the layer on which the scan line SL and the gate electrodes SG and DG are formed, but the data line DL and the driving current line VDD can be formed on the different layer from the scan line SL. The passivation layer PAS can be stacked on the gate electrodes SG and DG, the source electrodes SS and DS and the drain electrodes SD and DD. The data line DL and the driving current line VDD can be disposed on the passivation layer PAS.

The light emitting diode OLE can include an anode electrode ANO, an emission layer EL and a cathode electrode CAT. The light emitting diode OLE can emit the light according to the amount of the electric current controlled by the driving thin film transistor DT. In other word, the light emitting diode OLE can be driven by the voltage differences between the low-level voltage and the high-level voltage controlled by driving thin film transistor DT, thereby the luminance of the electroluminescence display can be controlled. The anode electrode ANO of the light emitting diode OLE can be connected to the driving drain electrode DD of the driving thin film transistor DT, and the cathode electrode CAT can be connected to the low-level power line VSS supplying the low-level electric voltage. The light emitting diode OLE can be driven by the voltage difference between the high-level electric voltage controlled by the driving thin film transistor DT and the low-level electric voltage.

The passivation layer PAS can be deposited on the substrate 110 having the thin film transistors ST and DT. By example, the passivation layer PAS can be made of the inorganic material such as silicon oxide (SiOx) or silicon nitride (SiNx). The planarization layer PL can be deposited on the passivation layer PAS. The planarization layer PL can be a film layer for flattening the non-uniform surface of the substrate 110 on which the thin film transistors ST and DT are formed. In order to make the height difference uniform, the planarization layer PL can be formed of an organic material, for example, but materials for the planarization layer PL need not be limited. The passivation layer PAS and the planarization layer PL can have a pixel contact hole PH exposing a part of the driving drain electrode DD of the driving thin film transistor DT.

The anode electrode ANO can be formed on the planarization layer PL covering the thin film transistors ST and DT. The anode electrode ANO can be connected to the driving drain electrode DD of the driving thin film transistor DT through the pixel contact hole PH. The anode electrode ANO can have different structures according to the emission structure of the light emitting diode OLE. For an example of the bottom emission type in which lights generated from the emission layer emit to the direction at which the substrate 110 is disposed, the anode electrode ANO can include a transparent conductive material. For another example of the top emission type in which lights generated from the emission layer emit to the opposite direction to the substrate 110, the anode electrode ANO can be made of metal material having excellent light reflectance. For example, the anode electrode can include any one of silver (Ag), aluminum (Al), molybdenum (Mo), gold (Au), magnesium (Mg), calcium (Ca) and barium (Ba), or alloy of them. Other metals or conductive materials can be used. Otherwise, the anode electrode ANO of the top emission type can include a metal layer having excellent light reflectance and a transparent conductive material layer on the metal layer.

In the present disclosure, the top emission type can be suitable for realization of ultra-high resolution. In the top emission type, the anode electrode ANO can have a maximum area in a pixel area defined by the data line DL, the driving current line VDD and the scan line SL. In this instance, the thin film transistors ST and DT can be disposed to overlap with the anode electrode ANO under the anode electrode ANO. In addition, the data line DL, the driving current line VDD and the scan line SL can also partially overlap the anode electrode ANO.

A bank BA can be formed on the anode electrode ANO. The bank BA can cover the circumference areas of the anode electrode ANO, and expose most of middle portions of the anode electrode ANO. The exposed area of the anode electrode ANO by the bank BA can be defined as an emission area of the pixel.

An emission layer EL is deposited on the anode electrode ANO and the bank BA. The emission layer EL can be deposited on the whole of the display area AA as covering the anode electrode ANO and the bank BA. For an embodiment, the emission layer EL can include two or more emission layers which are vertically stacked for generating different lights and emitting white light from a combination of the different lights. For example, the emission layer EL can include a first emission layer and a second emission layer for combining a first color light and a second color light to emit white light.

For another embodiment, the emission layer EL can include any one of a blue emission layer, a green emission layer and a red emission layer for providing color light allocated at the pixel. In this instance, the emission layer EL can be disposed as being isolated within each emission area defined by the bank BA. In addition, the light emitting diode OLE can further include functional layers for enhancing the emission efficiency and/or the light emitting time of the emission layer EL.

A cathode electrode CAT is deposited on the emission layer EL as being in surface-contact with the emission layer EL. The cathode electrode CAT is deposited as covering an entire surface of the substrate 110 as being connected with the emission layer EL disposed at all pixels. For the top emission type, the cathode electrode CAT can be made of transparent conductive material such as indium-tin-oxide (ITO) or indium-zinc-oxide (IZO).

After completing the light emitting diode OLE after depositing the cathode electrode CAT, the color filter CF having the micro-cavity structure can be formed on the cathode electrode CAT. For example, according to FIG. 4 showing a blue pixel, a first half-transparent layer HT1 can be formed on the cathode electrode CAT. The first half-transparent layer HT1 can transmit a portion of the incident light and reflect a rest portion of the incident light. For example, the first half-transparent layer HT1 can be an ultra-thin metal layer formed of a metal material such as aluminum (Al), silver (Ag), gold (Au) or magnesium (Mg) to a thickness of 10 nm to 20 nm.

The distance between the anode electrode ANO and the first half-transparent layer HT1, which in detail can be the distance between the upper surface of the anode electrode ANO and the lower surface of the first half-transparent layer HT1, can correspond to a resonance distance which is an integer multiple of a wavelength of light emitted from the emission layer EL disposed in the blue pixel. The thickness of the emission layer EL and the cathode electrode CAT can be adjusted so that the distance between the anode electrode ANO and the first half-transparent layer HT1 can correspond to the resonance distance. In addition, when the anode electrode ANO is formed of a metal layer and a transparent conductive material layer is stacked thereon, the resonance distance can be further finely adjusted by controlling the thickness of the transparent conductive material layer.

For example, the distance corresponding to the sum of the thicknesses of the emission layer EL and the cathode electrode CAT can correspond to an integer multiple of a wavelength of light emitted from the blue pixel. In this instance, when the light emitted from the emission layer EL passes through the cathode electrode CAT, and then light reflected at the interface between the cathode electrode CAT and the first half-transparent layer HT1 is reflected again by the anode electrode ANO, the amount of light is not lost and can be reflected back toward the cathode electrode CAT, due to the micro-cavity effect. Otherwise, when the distance between the anode electrode ANO and the first half-transparent layer HT1 does not correspond to an integer multiple of the wavelength of light emitted from the blue pixel, the amount of light can be lost or reduced, as the light reflected from the first half-transparent layer HT1 is reflected again by the anode electrode ANO.

In some instances, when the distance between the anode electrode ANO and the first half-transparent layer HT1 is not an integer multiple of the wavelength of light emitted from the pixel, a transparent layer for ensuring the resonance distance for micro-cavity effect can be further included between the cathode electrode CAT and the first half-transparent layer HT1.

Here, the first half-transparent layer HT1 and/or the transparent layer for the micro-cavity can be in contact with the cathode electrode CAT. However, by example, the transparent layer can be made of a non-conductive material so as not to have electrical conductivity.

The blue color filter CFB can be deposited on the first half-transparent layer HT1. Approximately 50% of the light emitted from the emission layer EL can be directed to the cathode electrode CAT, and the remaining approximately 50% of the light can be directed to the anode electrode ANO. A portion of the light directed to the cathode electrode CAT can pass through the cathode electrode CAT and the first half-transparent layer HT1, and can be incident into the blue color filter CFB. The remaining portion of the light directed to the cathode electrode CAT can be reflected at the interface between the first half-transparent layer HT1 and the cathode electrode CAT, and can be directed to the anode electrode ANO.

Lights directed to the anode electrode ANO can be reflected from the anode electrode ANO, and return to the cathode electrode CAT. Here, lights reflected at the interface between the first half-transparent layer HT1 and the cathode electrode CAT can be reflected from the anode electrode ANO, while maintaining the maximum amount of light. Most of the lights generated from the emission layer EL can be incident into the blue color filter CFB along the above-mentioned light path. Only lights having blue wavelength among the light incident into the blue color filter CFB can be transmitted at the blue color filter CFB and then can be emitted to the outside.

The electroluminescence display according to the present disclosure can further comprise a light shielding layer LS. The light shielding layer LS can be disposed under the semiconductor layers SA and DA in order to prevent or reduce the characteristics of the channel area of the semiconductor layer from being deteriorated by the light intruded into the semiconductor layers SA and DA. For example, the light shielding layer LS can be first formed on the substrate 110 where the semiconductor layers SA and DA can be formed later, and then a buffer layer BUF can be deposited on the entire surface of the substrate 110.

In addition to preventing external light from penetrating into the semiconductor layers SA and DA, the light shielding layer LS can be used for a repair element for connecting a defective pixel to a neighboring normal pixel for the connected pixels to operate normally. Otherwise, the light shielding layer LS can be used for the data line DL and/or the driving current line VDD. For another example, the light shielding layer LS can be used for an additional gate electrode for implementing a double gate thin film transistor, since the light shielding layer LS can be overlapped with the semiconductor layers SA and DA.

The micro-cavity structure can be applied for maximizing an emission efficiency of light having a specific color emitted from the emission layer EL. Accordingly, in the following embodiments, various examples of structures for successive pixels emitting blue light, green light and red light will be described.

First Example Embodiment

Figure 5:
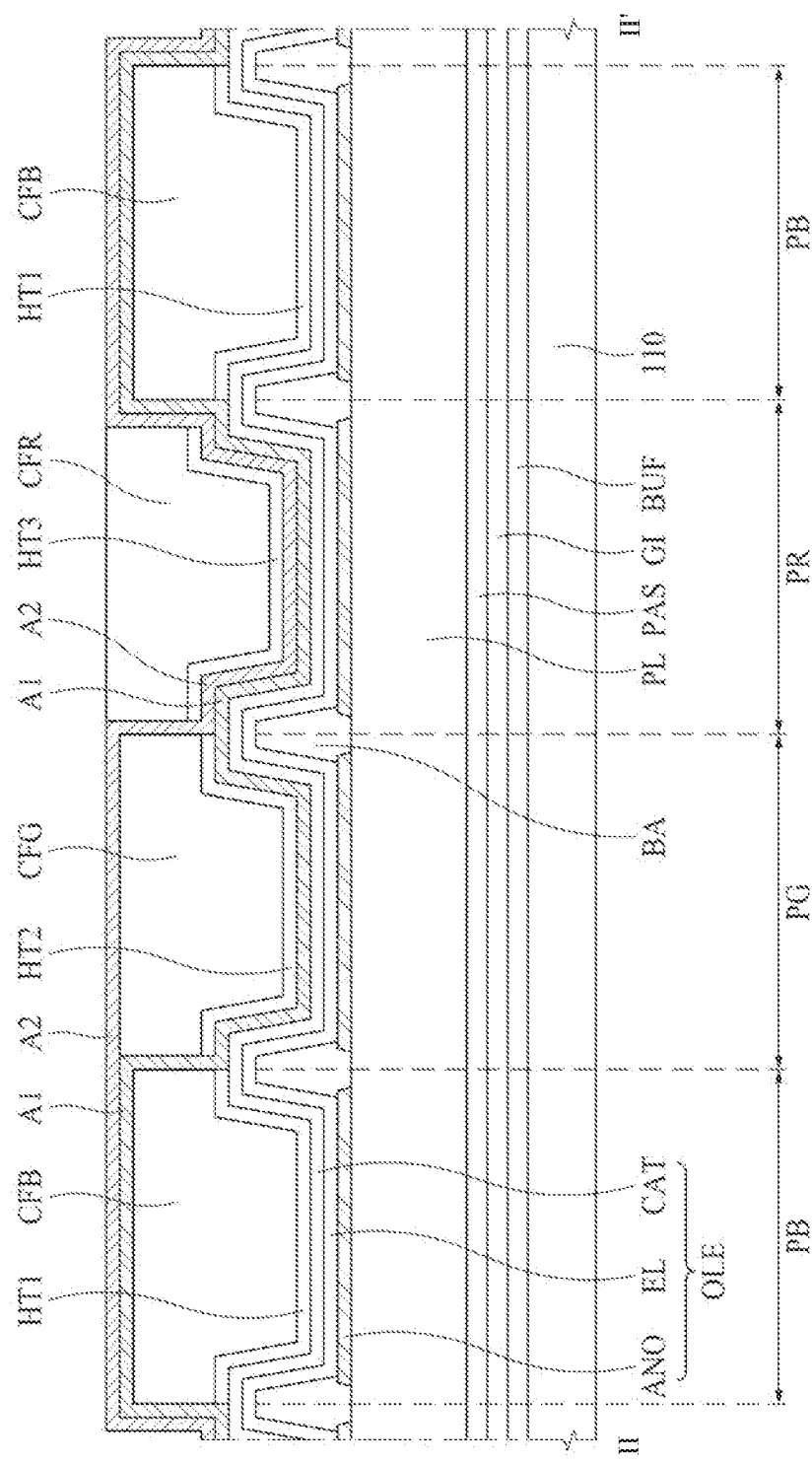
FIG. 5 is a cross-sectional view along to cutting line II-II' in FIG. 3, for illustrating a structure of successive sub-pixels in an electroluminescence display according to a first example embodiment of the present disclosure.

Hereinafter, referring to FIG. 5, a first example embodiment of the present disclosure will be explained. FIG. 5 is a cross-sectional view along to cutting line II-II' in FIG. 3, for illustrating a structure of successive sub-pixels in an electroluminescence display according to the first example embodiment of the present disclosure.

The buffer layer BUF can be deposited on the substrate 110. The gate insulating layer GI can be formed on the buffer layer BUF. The passivation layer can be deposited on the gate insulating layer GI. The planarization layer PL can be formed on the passivation layer PAS.

A plurality of anode electrodes ANO can be formed on the planarization layer PL. Each anode electrode ANO can be allocated at the blue pixel PB, the green pixel PG and the red pixel PR.

The bank BA can be formed as covering circumferences of the anode electrode ANO and exposing most of middle portions of the anode electrode ANO. The emission layer EL can be deposited on the bank BA and the anode electrode ANO. The single layer of the emission layer EL, as shown in FIG. 5, can be deposited commonly on the entire surface of the substrate 110 including all pixels PB, PG and PR. For another example, different emission layers emitting light of different color can be disposed in each pixel. For example, a blue emission layer can be disposed in the blue pixel PB, a green emission layer can be disposed in the green pixel PG, and a red emission layer can be disposed in the red pixel PR.

The cathode electrode CAT is deposited on the emission layer EL. By example, the cathode electrode CAT can be formed as a single common layer connecting all pixels PB, PG and PR on the entire surface of the substrate 110. After depositing the cathode electrode CAT, the light emitting diode OLE can be completed including the anode electrode ANO, the emission layer EL and the cathode electrode CAT.

A first half-transparent layer HT1 can be formed in the blue pixel PB on the cathode electrode CAT. In addition, the blue color filter CFB can be formed on the first half-transparent layer HT1. By example, the first half-transparent layer HT1 and the blue color filter CFB can be patterned to have the same width as each other. In the blue pixel PB, the emission layer EL and the cathode electrode CAT can be stacked between the anode electrode ANO and the first half-transparent layer HT1, and the thickness of a sum of the emission layer EL and the cathode electrode CAT can correspond to the resonance distance of blue light.

A first transparent layer A1 can be deposited on the entire surface of the substrate 110 having the blue color filter CFB. The first transparent layer A1 can include aluminum oxide ($Al_2O_3$). Aluminum oxide is an insulator and a transparent material, and is suitable material for ensuring a resonance distance. However, the first transparent layer A1 need not be limited thereto. The first transparent layer A1 can be a thin film made of silicon oxide, silicon nitride, polyimide or a monomer, as well as other materials.

A second half-transparent layer HT2 can be formed in the green pixel PG on the first transparent layer A1. In addition, the green color filter CFG can be formed on the second half-transparent layer HT2. By example, the second half-transparent layer HT2 and the green color filter CFG can be patterned to have the same width as each other. In the green pixel PG, the emission layer EL, the cathode electrode CAT and the first transparent layer A1 can be stacked between the anode electrode ANO and the second half-transparent layer HT2, and the thickness of a sum of the emission layer EL, the cathode electrode CAT and the first transparent layer A1 can correspond to the resonance distance of green light. In embodiments of the present disclosure, the second half-transparent layer HT2 can include the same material as that of the first half-transparent layer HT1, but such is not required.

A second transparent layer A2 can be deposited on the entire surface of the substrate 110 having the green color filter CFG. The second transparent layer A2 can include aluminum oxide ($Al_2O_3$). Aluminum oxide is an insulator and a transparent material, and is suitable material for ensuring a resonance distance.

A third half-transparent layer HT3 can be formed in the red pixel PR on the second transparent layer A2. In addition, the red color filter CFR can be formed on the third half-transparent layer HT3. By example, the third half-transparent layer HT3 and the red color filter CFR can be patterned to have the same width as each other. In the red pixel PR, the emission layer EL, the cathode electrode CAT, the first transparent layer A1 and the second transparent layer A2 can be stacked between the anode electrode ANO and the third half-transparent layer HT3, and the thickness of a sum of the emission layer EL, the cathode electrode CAT, the first transparent layer A1 and the second transparent layer A2 can correspond to the resonance distance of red light. In embodiments of the present disclosure, the third half-transparent layer HT3 can include the same material as that of the first half-transparent layer HT1 or the second half-transparent layer HT2, but such is not required.

Accordingly, the electroluminescence display according to the first example embodiment can ensure a unique resonance distance for each pixel, so that each of blue light, green light and red light can have the maximum light efficiency.

In addition, the first transparent layer A1 can be disposed between the blue color filter CFB and the green color filter CFG. The second transparent layer A2 can be disposed between the green color filter CFG and the red color filter CFR. Furthermore, the first transparent layer A1 and the second transparent layer A2 can be disposed between the red color filter CFR and the blue color filter CFB. In detail, a transparent insulating thin layer made of aluminum oxide can be disposed between each color filters CF. However, the material for the transparent insulating thin layer need not be limited to the aluminum oxide, but can be a thin layer made of silicon oxide, silicon nitride, polyimide or a monomer, as well as other materials.

The transparent insulating thin layer including aluminum oxide can have a refractive index lower than that of the blue color filter CFB, the green color filter CFG and the red color filter CFR. As the result, for light propagating in the lateral direction inside the color filter CF, total reflection can occur at the interface between the sidewall of the color filter CF and the transparent insulating thin layer made of aluminum oxide, the light can re-enter into the inside of the color filter CF and eventually light can be emitted in the upward direction. For example, colors can be not mixed between neighboring color pixels, and light can be emitted restrictedly within the area of each color pixel. The electroluminescence display according to the first example embodiment of the present disclosure has ultra-high resolution because color mixing does not occur between the pixels even when the black matrix is not provided between the pixels. As shown in FIG. 5, a color filter (e.g., CFB) of a pixel (e.g., BP) is separated from a color filter (e.g., CFG) of an adjacent pixel (e.g., PG) by a gap, and such gaps are provided between adjacent pixels. At least one of the first transparent layer A1 and the second transparent layer A2 can be interposed between the adjacent pixels. Each of the pixels can have at least one of the first transparent layer A1 and the second transparent layer A2 on at least one of an upper surface, a side surface and a bottom surface of the color filter.

Second Example Embodiment

Figure 6:
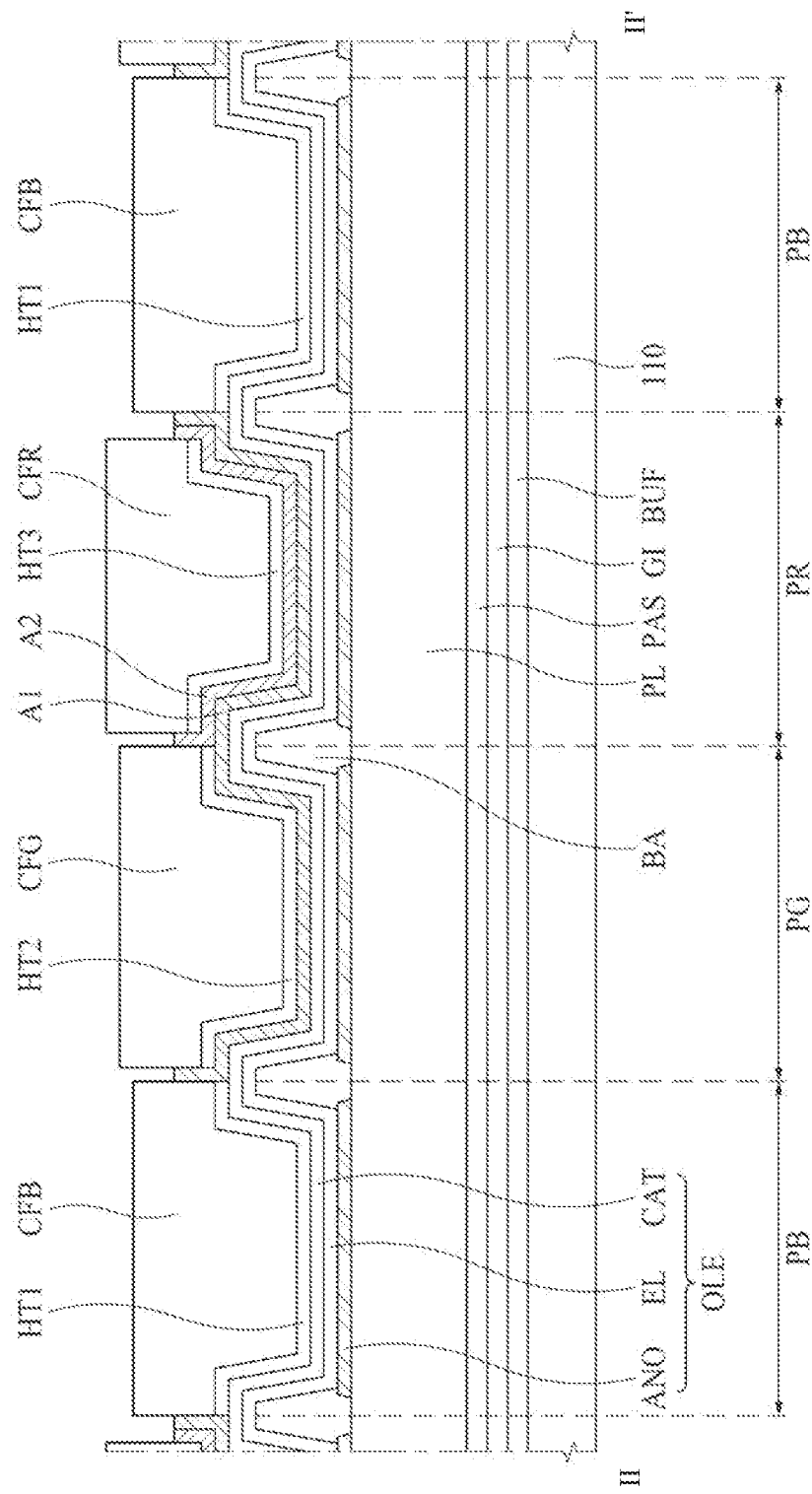
FIG. 6 is a cross-sectional view along to cutting line II-II' in FIG. 3, for illustrating a structure of successive sub-pixels in an electroluminescence display according to a second example embodiment of the present disclosure.

Hereinafter, referring to FIG. 6, a second example embodiment of the present disclosure will be explained. FIG. 6 is a cross-sectional view along to cutting line II-II' in FIG. 3, for illustrating a structure of successive sub-pixels in an electroluminescence display according to the second example embodiment of the present disclosure.

The electroluminescence display according to the second embodiment of the present disclosure shown in FIG. 6 can have a similar structure with that of the first example embodiment shown in FIG. 5. Therefore, redundant explanations that are not necessarily required for the description will not be duplicated, or may be briefly provided. An example different feature of the second example embodiment is that the first transparent layer A1 and/or the second transparent layer A2 stacked on the blue color filter CFB and the green color filter CFG described in the first embodiment is removed or lacking.

For example, the first half-transparent layer HT1 and the blue color filter CFB can be sequentially stacked on the cathode electrode CAT of the light emitting diode OLE in the blue pixel PB area. By example, the first half-transparent layer HT1 and the blue color filter CFB can be patterned as having the same side (or width).

The first transparent layer A1 can be deposited initially on the entire surface of the substrate 110 having the blue color filter CFB and later partially removed. The first transparent layer A1 includes aluminum oxide ($Al_2O_3$).

In the green pixel PG area on the first transparent layer A1, the second half-transparent layer HT2 and the green color filter CFG can be sequentially stacked. By example, the second half-transparent layer HT2 and the green color filter CFG can be patterned to have the same width as each other.

The second transparent layer A2 can be deposited initially on the entire surface of the substrate 110 having the green color filter CFG and later partially removed. The second transparent layer A2 can include aluminum oxide ($Al_2O_3$).

In the red pixel PR area on the second transparent layer A2, the third half-transparent layer HT3 and the red color filter CFR can be sequentially stacked. By example, the third half-transparent layer HT3 and the red color filter CFR can be patterned to have the same width as each other.

Accordingly, the electroluminescence display according to the second example embodiment can ensure a unique resonance distance for each pixel, so that each of blue light, green light and red light can have the maximum light efficiency.

After that, the first transparent layer A1 and/or the second transparent layer A2, which can be stacked on the upper surface of the blue color filter CFB and the green color filter CFG can be etched to be removed. As a result, all upper surface of the blue color filter CFB, the green color filter CFG and the red color filter CFR can be exposed because the first transparent layer A1 and/or the second transparent layer A2 are not disposed on the upper surfaces of any of the blue color filter CFB, the green color filter CFG, and the red color filter CFR. Although the first transparent layer A1 and the second transparent layer A2 are transparent materials, they may not have 100% transmittance even when their transparency is high, so that the transmittance can be slightly lowered. However, according to the second example embodiment, the upper surface and side surface of the color filters need not be covered by the transparent layers, but be exposed to the air. Therefore, the second embodiment can provide the electroluminescence display further ensuring the amount of light emitted to the upper direction.

For the instance that the first transparent layer A1 and the second transparent layer A2 are made of aluminum oxide, the etching process can be conducted with a potassium hydroxide (KOH) solution. At this time, the remaining upper end of the first transparent layer A1 and the second transparent layer A2 to be etched can be located at the higher position than the height of the first half-transparent layer HT1, the second half-transparent layer HT2 and the third half-transparent layer HT3. Accordingly, the half-transparent layer can be prevented from being damaged during the etching process of the transparent layer since a portion of the transparent layer is located at the side surface of the color filter CF.

In addition, the first transparent layer A1 and air layer can be disposed between the blue color filter CFB and the green color filter CFG. The second transparent layer A2 and the air layer can be disposed between the green color filter CFG and the red color filter CFR. Further, the first transparent layer A1, the second transparent layer A2 and the air layer can be disposed between the red color filter CFR and the blue color filter CFB. Accordingly, between each color filters CF, a transparent insulating layer can be disposed at lower portion, and an air layer can be disposed at the upper portion at the side surface of the color filter CF.

The transparent insulating layer and the air layer can have lower refractive indices than that of the color filter including the blue color filter CFB, the green color filter CFG and the red color filter CFR. Accordingly, the lights propagating to the lateral direction inside the color filter CF can re-enter into the color filter CF by total reflection at the interface between the side surface of the color filter CF and the transparent insulating layer, and at the interface between the side surface of the color filter CF and the air layer, and then eventually exit upward. For example, light colors can be not be mixed between neighboring color pixels, and light can be emitted strictly within an area of each color pixel. As shown in FIG. 6, a color filter (e.g., CFB) of a pixel (e.g., BP) is separated from a color filter (e.g., CFG) of an adjacent pixel (e.g., PG) by a gap, and such gaps are provided between adjacent pixels. At least one of the first transparent layer A1, the second transparent layer A2 and air can be interposed between the adjacent pixels. Each of the pixels can have at least one of the first transparent layer A1 and the second transparent layer A2 on at least one of a side surface and a bottom surface of the color filter.

Third Example Embodiment

Figure 7:
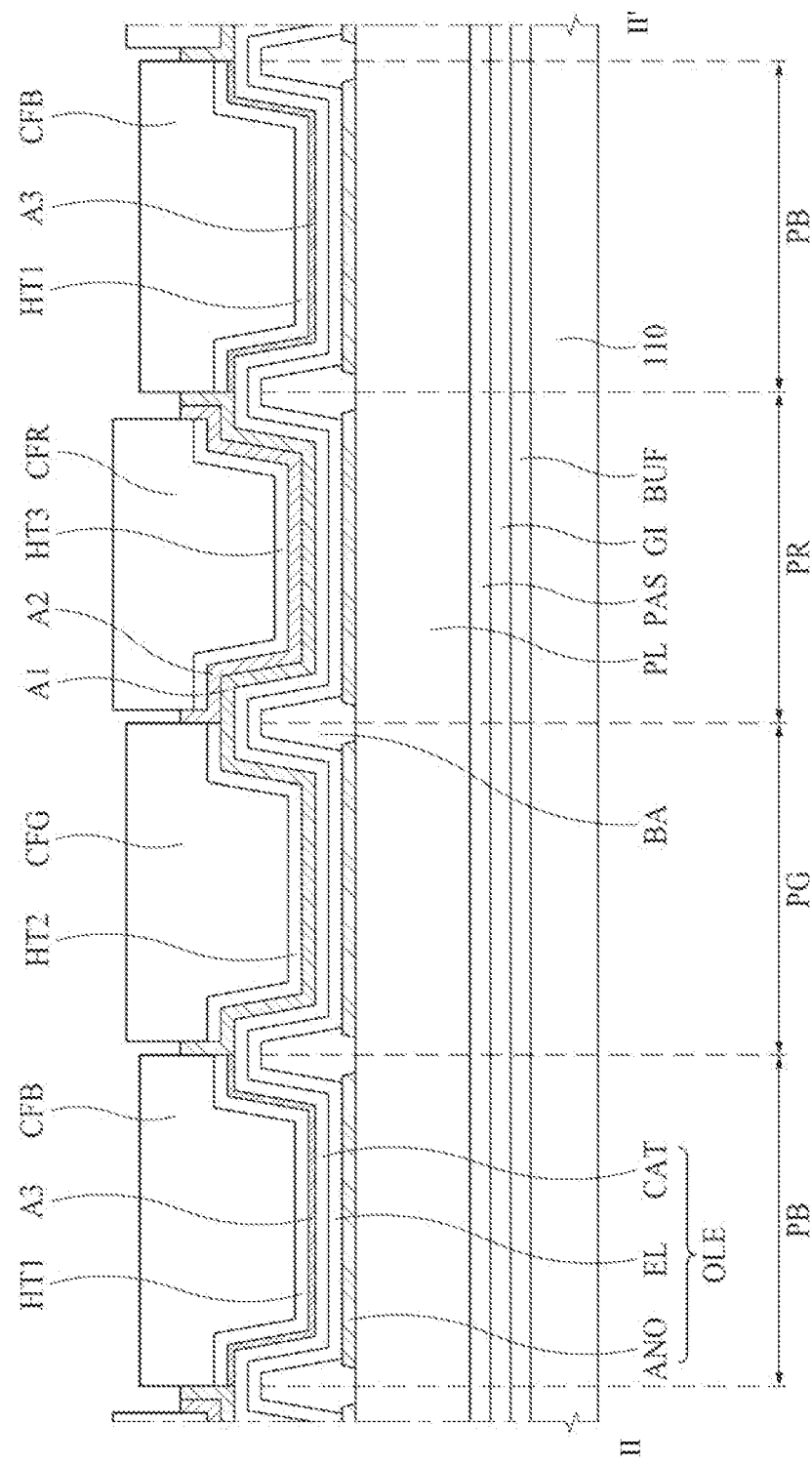
FIG. 7 is a cross-sectional view along to cutting line II-II' in FIG. 3, for illustrating a structure of successive sub-pixels in an electroluminescence display according to a third example embodiment of the present disclosure.

Hereinafter, referring to FIG. 7, a third embodiment of the present disclosure will be explained. FIG. 7 is a cross-sectional view along to cutting line II-II' in FIG. 3, for illustrating a structure of successive sub-pixels in an electroluminescence display according to a third embodiment of the present disclosure.

The electroluminescence display according to the third embodiment of the present disclosure shown in FIG. 7 can have a similar structure with that of the second embodiment shown in FIG. 6. Therefore, redundant explanations that are not necessarily required for the description will not be duplicated, or may be briefly provided. An example different feature of the third embodiment is that the blue pixel PB can further include a third transparent layer A3 disposed between the first half-transparent layer HT1 and the cathode electrode CAT. In embodiments of the present disclosure, the third transparent layer A3 can include the same material as that of the first transparent layer A1 or the second transparent layer A2.

In the green pixel PG, the first transparent layer A1 can be further included in order to ensure the resonance distance between the anode electrode ANO and the second half-transparent layer HT2. In the red pixel PR, the first transparent layer A1 and the second transparent layer A2 can be further included in order to ensure the resonance distance between the anode electrode ANO and the third half-transparent layer HT3.

On the other hand, in the blue pixel PB, the resonance distance between the anode electrode ANO and the first half-transparent layer HT1 can be decided by the thicknesses of the emission layer EL and the cathode electrode CAT. However, the thicknesses of the emission layer EL and the cathode electrode CAT may not satisfy the resonance distance of blue light. In this instance, it can be required to further form the third transparent layer A3 between the first half-transparent layer HT1 and the cathode electrode CAT to ensure the resonance distance of blue light.

In particular, blue light has a wavelength band of 450 nm to 490 nm, green light has a wavelength band of 490 nm to 570 nm, and red light has a wavelength band of 630 nm to 750 nm. Considering these conditions, the distance between the first half-transparent layer HT1 disposed in the blue pixel PB and the cathode electrode CAT is the smallest (or shortest). The distance between the third half-transparent layer HT3 in the red pixel PR and the cathode electrode CAT is the largest (or longest). The distance between the second half-transparent layer HT2 disposed in the green pixel PG and the cathode electrode CAT can have an intermediate length. As shown in FIG. 7, a color filter (e.g., CFB) of a pixel (e.g., BP) is separated from a color filter (e.g., CFG) of an adjacent pixel (e.g., PG) by a gap, and such gaps are provided between adjacent pixels. At least one of the first transparent layer A1, the second transparent layer A2 and air can be interposed between the adjacent pixels. Each of the pixels can have at least one of the first transparent layer A1 and the second transparent layer A2 on at least one of a side surface and a bottom surface of the color filter.

As the result, the electroluminescence display according to the third example embodiment of the present disclosure has the micro-cavity structure to maximize the light emitting efficiency. Since there is no transparent layer on the color filter, the light emitting efficiency can be further enhanced. Further, since a transparent layer and/or an air layer having a lower refractive index than that of the color filter is disposed between the color filters, color mixing does not occur between pixels, even though there is no black matrix between pixels. Accordingly, the present disclosure can provide an electroluminescence display having ultra-high resolution and maximized light emitting efficiency and luminous efficiency.

In embodiments of the present disclosure, the various example embodiments shown in FIGS. 4, 5, 6, 7 can further include additional layers placed on the color filter layer CFB such as a polarizer and protective layers.

The features, structures, effects and so on described in the above examples of the present disclosure are included in at least one example of the present disclosure, and are not limited to only one example. Furthermore, the features, structures, effects and the likes explained in at least one example can be implemented in combination or modification with respect to other examples by those skilled in the art to which this disclosure belongs. Accordingly, contents related to such combinations and variations should be construed as being included in the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
   a substrate; and
   a plurality of pixels on the substrate, each pixel including a first electrode, a light emission layer on the first electrode, and a second electrode on the light emission layer,
   wherein each pixel includes a half transparent layer on the second electrode, and a color filter on the half transparent layer,
   wherein the plurality of pixels include a first pixel including a first color filter, a second pixel including a second color filter, and a third pixel including a third color filter,
   wherein the first pixel does not include a transparent layer,
   wherein the second pixel includes a first transparent layer below the half transparent layer, and
   wherein the third pixel includes the first transparent layer and a second transparent layer both below the half transparent layer.

2. The electroluminescence display of claim 1, wherein a color filter of each pixel is separated from a color filter of an adjacent pixel by a gap.

3. The electroluminescence display of claim 2, wherein the half transparent layer and the color filter of each pixel have a same width.

4. The electroluminescence display of claim 1,
   wherein the first pixel includes a transparent layer.

5. The electroluminescence display of claim 4,
   wherein, for the first pixel, the first transparent layer and the second transparent layer are both above the color filter, and
   wherein, for the second pixel, the second transparent layer is above the color filter.

6. The electroluminescence display of claim 5, wherein the first transparent layer is further between the first color filter and the second color filter,
   wherein the second transparent layer is further between the second color filter and the third color filter, and
   wherein both the first transparent layer and the second transparent layer are further between the third color filter and the first color filter.

7. The electroluminescence display of claim 5, wherein, in the adjacent pixel, the first transparent layer is disposed between light emitting diode and the color filter, or the color filter is disposed between the light emitting diode and the first transparent layer.

8. The electroluminescence display of claim 5, wherein the adjacent pixel further includes a second transparent layer having a second refractive index that is lower than the refractive index of the color filter of the adjacent pixel, and
   wherein the second transparent layer is further located in the gap.

9. The electroluminescence display of claim 8, wherein, in the adjacent pixel, the second transparent layer is disposed between light emitting diode and the color filter, or the color filter is disposed between the light emitting diode and the second transparent layer.

10. The electroluminescence display of claim 8, wherein outer surfaces of the plurality of pixels are coplanar.

11. The electroluminescence display of claim 4, wherein the transparent layer has a first refractive index that is lower than a refractive index of each color filter.

12. The electroluminescence display of claim 4, wherein the half transparent layer includes a metal, and
    wherein the metal includes at least one of silver (Ag), aluminum (Al), molybdenum (Mo), gold (Au), magnesium (Mg), calcium (Ca) and barium (Ba), or an alloy thereof.

13. The electroluminescence display of claim 4, wherein the transparent layer includes a dielectric material, and
    wherein the dielectric material is at least one of aluminum oxide, silicon oxide, silicon nitride, polyimide and a monomer.

14. The electroluminescence display of claim 1, wherein the first transparent layer is further between the first color filter and the second color filter,
    wherein the second transparent layer is further between the second color filter and the third color filter, and
    wherein both the first transparent layer and the second transparent layer are further between the third color filter and the first color filter.

15. The electroluminescence display of claim 14, where an air layer is further between the first color filter and the second color filter, between the second color filter and the third color filter, and between the third color filter and the first color filter.

16. The electroluminescence display of claim 15, wherein the first transparent layer is interposed between the half transparent layer of the first pixel and the half transparent layer of the second pixel,
    wherein the second transparent layer is interposed between the half transparent layer of the second pixel and the half transparent layer of the third pixel, and
    wherein both the first transparent layer and the second transparent layer are interposed between the third color filter and the first color filter.

17. The electroluminescence display of claim 1, wherein a black matrix is not included between the plurality of pixels.

18. The electroluminescence display of claim 1, wherein the plurality pixels include a blue pixel including a blue color filter, a green pixel including a green color filter and a red pixel including a red color filter.

19. An electroluminescence display comprising:
    a substrate; and
    a plurality of pixels on the substrate, each pixel including a first electrode, a light emission layer on the first electrode, and a second electrode on the light emission layer,
    wherein each pixel includes a half transparent layer on the second electrode, and a color filter on the half transparent layer,
    wherein the plurality of pixels include a first pixel including a first color filter, a second pixel including a second color filter, and a third pixel including a third color filter,
    wherein, the first pixel includes a third transparent layer below the half transparent layer,
    wherein the second pixel includes a first transparent layer below the half transparent layer,
    wherein, the third pixel includes the first transparent layer and a second transparent layer both below the half transparent layer, and
    wherein a thickness of the third transparent layer is less than a thickness of the first transparent layer.

* * * * *